US012672479B2

(12) United States Patent
Park et al.

(10) Patent No.: US 12,672,479 B2
(45) Date of Patent: Jun. 30, 2026

(54) DISPLAY DEVICE AND METHOD OF MANUFACTURING THE SAME

(71) Applicant: SAMSUNG DISPLAY CO., LTD., Yongin-si (KR)

(72) Inventors: Junhyeong Park, Yongin-si (KR); Jongho Hong, Yongin-si (KR); Hyejin Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/602,995

(22) Filed: Mar. 12, 2024

(65) Prior Publication Data

US 2024/0224580 A1     Jul. 4, 2024

Related U.S. Application Data

(62) Division of application No. 16/861,691, filed on Apr. 29, 2020, now Pat. No. 11,950,444.

(30) Foreign Application Priority Data

May 3, 2019     (KR) ......................... 10-2019-0052382

(51) Int. Cl.
  *H10K 77/10*       (2023.01)
  *H10K 59/12*       (2023.01)
       (Continued)
(52) U.S. Cl.
  CPC ......... *H10K 77/111* (2023.02); *H10K 59/122* (2023.02); *H10K 59/124* (2023.02);
       (Continued)
(58) Field of Classification Search
  CPC . Y02P 70/50; Y02E 10/549; H10K 2102/311; H10K 59/1201; H10K 59/131;
       (Continued)

(56) References Cited

U.S. PATENT DOCUMENTS 10,038,163 B2     7/2018   Kim et al.
10,121,844 B2     11/2018  Park et al.
       (Continued)

FOREIGN PATENT DOCUMENTS

CN       102437288 A     5/2012
CN       104916787 A     9/2015
       (Continued)

OTHER PUBLICATIONS

Office Action dated Sep. 26, 2024 in corresponding Chinese patent application No. 202010355005.1, 8 pages.
       (Continued)

*Primary Examiner* — Vongsavanh Sengdara
(74) *Attorney, Agent, or Firm* — F. CHAU & ASSOCIATES, LLC

(57)     ABSTRACT

A display device includes a first island that includes a first display element disposed on a substrate, a second island that includes a second display element disposed on the substrate and spaced apart from the first island, a plurality of connection parts that connect the first island to the second island, through parts formed between the plurality of connection parts and that penetrate into the substrate, and an encapsulation layer that seals the first and second islands, and that includes a first inorganic encapsulation layer and a second inorganic encapsulation layer. The encapsulation layer of the first island includes an organic encapsulation layer, and the encapsulation layer of the second island does not include an organic encapsulation layer.

12 Claims, 13 Drawing Sheets

(51) Int. Cl.

| | |
|---|---|
| *H10K 59/122* | (2023.01) |
| *H10K 59/124* | (2023.01) |
| *H10K 59/131* | (2023.01) |
| *H10K 59/80* | (2023.01) |
| *H10K 102/00* | (2023.01) |

(52) U.S. Cl.
CPC ..... *H10K 59/8731* (2023.02); *H10K 59/1201* (2023.02); *H10K 59/131* (2023.02); *H10K 2102/311* (2023.02)

(58) Field of Classification Search
CPC ............. H10K 59/8731; H10K 59/124; H10K 59/122; H10K 77/111; H10K 71/00
See application file for complete search history.

(56) References Cited

U.S. PATENT DOCUMENTS

| | | |
|---|---|---|
| 10,135,011 B2 | 11/2018 | Park et al. |
| 10,281,409 B2 | 5/2019 | Yang |
| 10,304,921 B2 | 5/2019 | Lee et al. |
| 10,468,628 B2 | 11/2019 | Kim et al. |
| 10,516,136 B2 | 12/2019 | Narutaki et al. |
| 2003/0064171 A1 | 4/2003 | Burrows et al. |
| 2003/0203210 A1 | 10/2003 | Graff et al. |
| 2013/0032803 A1 | 2/2013 | Moon et al. |
| 2016/0043346 A1 | 2/2016 | Kamiya et al. |
| 2016/0268352 A1 | 9/2016 | Hong et al. |
| 2016/0293571 A1 | 10/2016 | Yoon et al. |
| 2017/0278920 A1* | 9/2017 | Park .................... H10K 59/124 |
| 2017/0279057 A1 | 9/2017 | Park et al. |
| 2017/0288168 A1 | 10/2017 | Kim et al. |
| 2018/0026225 A1 | 1/2018 | Kwon et al. |
| 2018/0090722 A1 | 3/2018 | Kim et al. |
| 2018/0114825 A1 | 4/2018 | Hong et al. |
| 2018/0159077 A1 | 6/2018 | Lee et al. |
| 2018/0212188 A1 | 7/2018 | Kwon et al. |
| 2018/0366529 A1 | 12/2018 | Lee et al. |
| 2019/0058160 A1* | 2/2019 | Kishimoto ................ G09F 9/30 |
| 2019/0198782 A1 | 6/2019 | Kim et al. |
| 2019/0372052 A1* | 12/2019 | Kishimoto ........... H10K 59/122 |
| 2019/0372058 A1 | 12/2019 | Kishimoto et al. |
| 2020/0350513 A1 | 11/2020 | Park et al. |

FOREIGN PATENT DOCUMENTS

| | | |
|---|---|---|
| CN | 106409869 A | 2/2017 |
| CN | 107221549 A | 9/2017 |
| CN | 107221550 A | 9/2017 |
| CN | 110731126 A | 1/2020 |
| KR | 10-2004-0106431 A | 12/2004 |
| KR | 1354578 B1 | 1/2014 |
| KR | 10-2016-0013489 A | 2/2016 |
| KR | 10-2017-0110209 A | 10/2017 |
| KR | 10-2017-0113934 A | 10/2017 |
| KR | 10-2018-0077898 A | 7/2018 |
| KR | 10-2018-0136652 A | 12/2018 |
| KR | 10-2018-0138251 A | 12/2018 |
| KR | 10-2019-0078723 A | 7/2019 |
| WO | WO2010077544 A1 | 7/2010 |

OTHER PUBLICATIONS

Chongpeng, "The study of thin-film encapsulation based on organic light-emitting diodes", Apr. 15, 2017, 83 pages.
Zeng, et al., "Recent Research Progress in Thin-Film Encapsulation for FOLED", Nov. 15, 2016, in Journal of Hunan University of Technology, vol. 30, No. 6, doi:10.3969/j.issn.1673-9833.2016.06.009, 6 pages.

* cited by examiner

DISPLAY DEVICE AND METHOD OF MANUFACTURING THE SAME

CROSS-REFERENCE TO RELATED APPLICATION

This application is a divisional of U.S. patent application Ser. No. 16/861,691, filed on Apr. 29, 2020 in the U.S. Patent and Trademark Office, which claims priority under 35 U.S.C. § 119 from Korean Patent Application No. 10-2019-0052382, filed on May 3, 2019 in the Korean Intellectual Property Office, the contents of both of which are herein incorporated by reference in their entireties.

BACKGROUND

1. Technical Field

One or more embodiments are directed to a display device and a method of manufacturing the same.

2. Discussion of the Related Art

As the field of display devices that visually display electrical signal information has developed, various flat panel display devices having excellent characteristics, such as slimness, light-weight, and low electrical consumption, have been introduced. Recently, foldable or rollable flexible display devices and stretchable display devices that can be modified in various forms, have been studied and developed.

SUMMARY

Slim and flexible display devices include a thin-film type encapsulation layer to prevent penetration of external moisture or oxygen.

When a thin-film encapsulation layer that includes at least one organic layer and at least one inorganic layer stacked together is formed on the entirety of the display device, stretchability thereof may be lowered. A thin-film encapsulation layer that includes only inorganic layers stacked thereon has improved stretchability but reduced coverage of dust material contained on the display device and gaps may form in edges of the encapsulation layer. Oxygen and moisture that penetrate into the gaps formed in the edges may promote deterioration of the display device.

One or more embodiments include a display device that includes a thin-film encapsulation layer that is both stretchable and rigid, and a method of manufacturing the same.

Additional aspects will be set forth in part in the description which follows and, in part, will be apparent from the description, or may be learned by practice of the presented embodiments.

According to one or more embodiments, a display device includes a first island that includes a first display element disposed on a substrate, a second island that includes a second display element disposed on the substrate, where the second island is spaced apart from the first island, a plurality of connection parts that connect the first island to the second island, through parts formed between the plurality of connection parts and that penetrate into the substrate, and an encapsulation layer that seals the first and second islands, where the encapsulation layer includes a first inorganic encapsulation layer and a second inorganic encapsulation layer. The encapsulation layer of the first island includes an organic encapsulation layer, and the encapsulation layer of the second island does not include an organic encapsulation layer.

The organic encapsulation layer may cover dust material included in the first display element.

The first inorganic encapsulation layer and the second inorganic encapsulation layer may be further disposed on the plurality of connection parts.

The first inorganic encapsulation layer and the second inorganic encapsulation layer may cover sides of the through parts.

The display device may further include wirings disposed on the plurality of connection parts and that transmit electrical signals to the first and second islands, and a step difference compensation layer disposed between the wirings where the step difference compensation layer includes an organic material.

The first inorganic encapsulation layer and the second inorganic encapsulation layer in the first island may be in contact with each other beyond an edge of the organic encapsulation layer.

The organic encapsulation layer may be disposed between the first inorganic encapsulation layer and the second inorganic encapsulation layer.

Each of the first and second display elements may include a pixel electrode, an intermediate layer, and an opposite electrode, and the pixel electrode may be positioned on a top surface of a planarization layer, and a pixel-defining layer may be provided to cover edges of the pixel electrode.

The first inorganic encapsulation layer may cover dust material contained on the opposite electrode.

The display device may further include a thin-film transistor disposed between the substrate and the planarization layer, a lower planarization layer disposed between the thin-film transistor and the planarization layer, and a connection metal disposed on the lower planarization layer.

The display device may further include a dam part disposed on the first inorganic encapsulation layer of the first island and may surround the organic encapsulation layer.

According to one or more embodiments, a method of manufacturing a display device includes forming a plurality of islands, wherein the plurality of islands include display elements disposed on a substrate and that are apart from each other, sealing each of the plurality of islands with an encapsulation layer that includes a first inorganic encapsulation layer and a second inorganic encapsulation layer, detecting dust material contained on a first island and recording coordinate information about the dust material before or after forming the first inorganic encapsulation layer, and forming an organic encapsulation layer on the first island that covers the dust material using the recorded coordinate information about the dust material.

The first inorganic encapsulation layer and the second inorganic encapsulation layer may include inorganic insulating layers.

The first inorganic encapsulation layer and the second inorganic encapsulation layer may be formed using chemical vapor deposition (CVD).

The organic encapsulation layer may be formed using inkjet printing or three- dimensional (3D) printing.

The organic encapsulation layer is not formed on an island in which the dust material is not detected.

The plurality of islands may be connected using a plurality of connection parts. The method may further include forming through parts between the plurality of connection parts that penetrate into a substrate.

According to one or more embodiments, a display device includes a plurality of islands spaced apart from each other, where each island includes a display element disposed on a substrate, a plurality of connection parts that interconnect the plurality of islands, through parts formed between the plurality of connection parts and that penetrate into the substrate, and an encapsulation layer that covers the plurality of islands, wherein the encapsulation layer includes a first inorganic encapsulation layer and a second inorganic encapsulation layer. The encapsulation layer includes an organic encapsulation layer on an island that contains dust material.

The organic encapsulation layer may be disposed between the first inorganic encapsulation layer and the second inorganic encapsulation layer on the island that contains dust material, and the first inorganic encapsulation layer and the second inorganic encapsulation layer in the island that contains dust material may be in contact with each other beyond an edge of the organic encapsulation layer.

The display device may further include a dam part disposed on the first inorganic encapsulation layer of the island that contains the dust material and that surrounds the organic encapsulation layer.

Other aspects, features, and advantages than the above-description will be apparent from a detailed description, the claims, and the drawings for implementing the present disclosure.

BRIEF DESCRIPTION OF THE DRAWINGS

FIG. 1 is an enlarged plan view of region A of a display device according to an embodiment.

FIG. 6 is a cross-sectional view of another example of the first unit part.

FIG. 7 is a cross-sectional view of a part of a second unit part.

FIG. 11 is a cross-sectional view that illustrates another embodiment of the first unit part.

DETAILED DESCRIPTION

Figure 2:
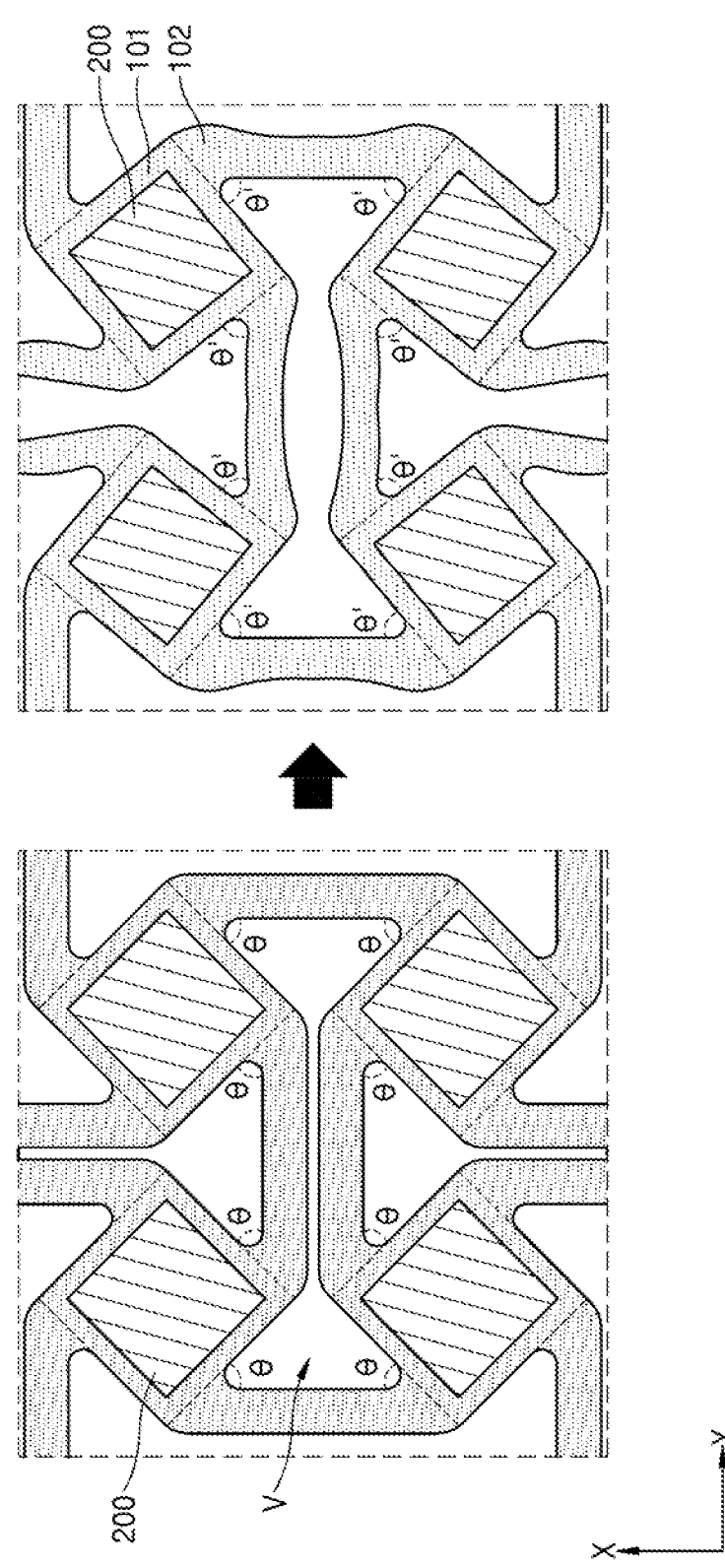
FIG. 2 illustrates a shape before and after extending a part of a substrate of the display device.

Reference will now be made in detail to embodiments, examples of which are illustrated in the accompanying drawings, wherein like reference numerals may refer to like elements throughout. In this regard, the present embodiments may have different forms and should not be construed as being limited to the descriptions set forth herein.

It will be understood that when a layer, region, or component is referred to as being "formed on," another layer, region, or component, it can be directly or indirectly formed on the other layer, region, or component.

Sizes of elements in the drawings may be exaggerated for convenience of explanation.

It will be understood that when a layer, region, or component is referred to as being "connected to," another layer, region, or component, it can be directly or indirectly connected to the other layer, region, or component. .

Hereinafter, embodiments of the present disclosure will be described more specifically with reference to the accompanying drawings. In the description with reference to the attached drawings, like reference numerals may be used for the same or corresponding elements, and a redundant description thereof may be be omitted.

Figure 1:
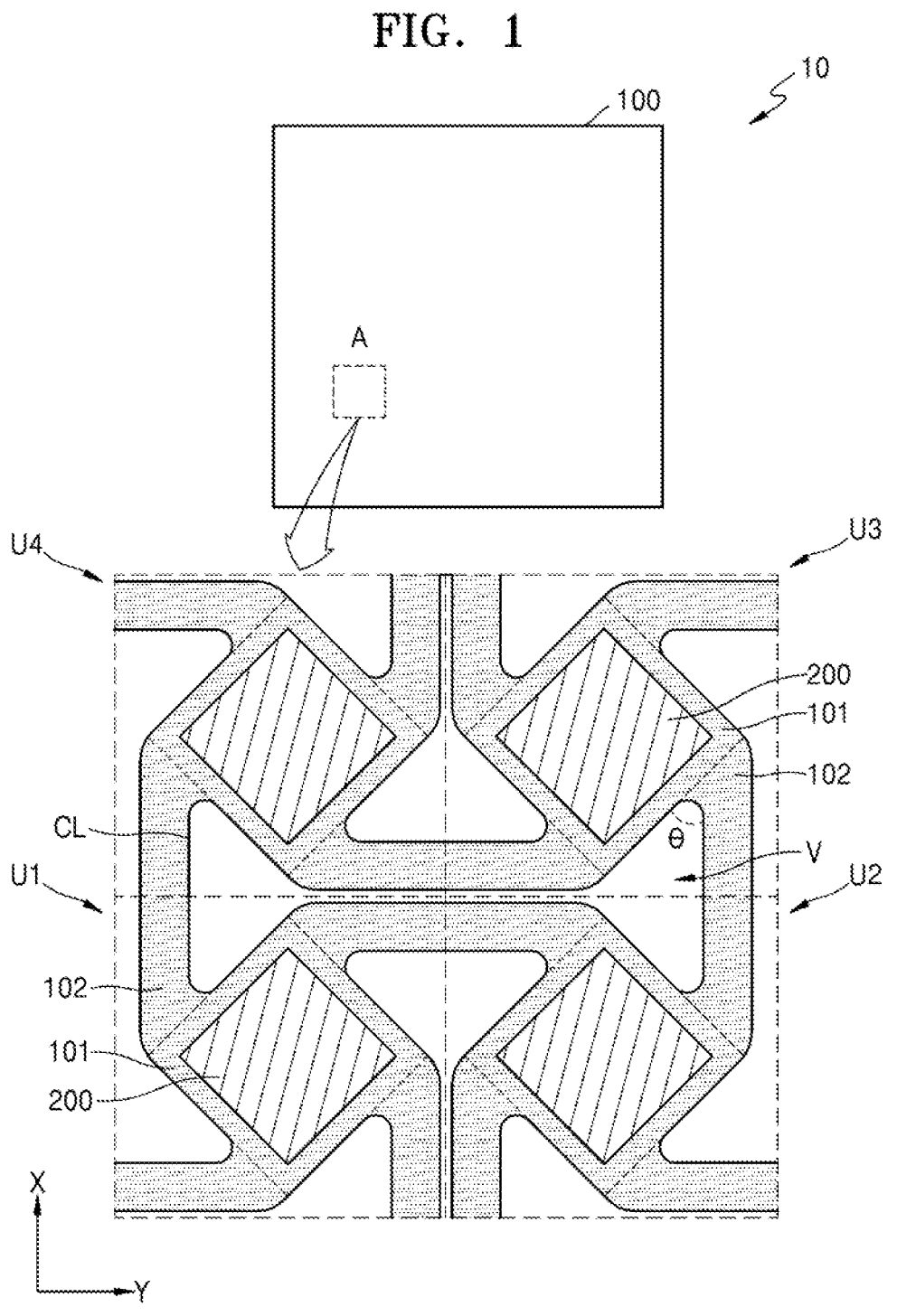

FIG. 1 is an enlarged plan view of region A of a display device according to an embodiment, and FIG. 2 illustrates a shape before and after extending a part of a substrate of the display device.

Referring to FIG. 1, a display device 10 according to an embodiment includes a plurality of islands 101 in which a unit display part 200 is formed, and a plurality of connection parts 102 that connect the plurality of islands 101 to each other. A plurality of through parts V that penetrate into a substrate 100 are formed between the plurality of connection parts 102.

According to an embodiment, the substrate 100 includes various materials. In detail, the substrate 100 may include of a glass, a metal, or an organic material. In an alternative embodiment, the substrate 100 includes a flexible material. For example, the substrate 100 includes a flexible, bendable, foldable, or rollable material. A flexible material suitable for forming the substrate 100 may be one of an ultra-thin glass, a metal, or plastic. When the substrate 100 includes plastic, the substrate 100 includes polyimide (PI). In another example, the substrate 100 includes different types of plastics.

According to an embodiment, the plurality of islands 101 are spaced apart from each other by a predetermined distance. For example, the plurality of islands 101 are repeatedly arranged in a first direction X and a second direction Y that crosses the first direction X, and thus, a planar lattice pattern can be formed. In an example, the first direction X and the second direction Y are perpendicular to each other. In another example, the first direction X and the second direction Y form an obtuse or acute angle.

According to an embodiment, a plurality of unit display parts 200 are arranged within the plurality of islands 101, respectively. The plurality of unit display parts 200 include at least one display element that emits visible light.

According to an embodiment, the plurality of connection parts 102 connect the plurality of islands 101 to each other. For example, four connection parts 102 are connected to each of the plurality of islands 101, as shown in FIG. 1. The four connection parts 102 connected to one island 101 extend in different directions and are thus connected to the adjacent islands 101.

According to an embodiment, at least a part of the plurality of islands 101 and the plurality of connection parts 102 include the same material. For example, the portion of the substrate 100 that forms the plurality of islands 101 and the portion of the substrate 100 that forms the plurality of connection parts 102 include the same material. In addition, the plurality of islands 101 and the plurality of connection parts 102 are integrally formed.

According to an embodiment, the through parts V penetrate into the substrate 100. The through parts V provide a separation space between the plurality of islands 101, reduce the weight of the substrate 100, and improve the flexibility of the substrate 100. In addition, the through parts V change shape when the substrate 100 is bent or rolled, and thus, stress during deformation of the substrate 100 can be reduced and abnormal deformation of the substrate 100 can be prevented, which improves durability of the substrate 100. Thus, user convenience is improved when the display device 10 is used, and the display device 10 can be easily incorporated into a wearable device.

According to an embodiment, the through parts V are formed by removing one region of the substrate 100 using a method such as etching. In another example, the through parts V are provided when the substrate 100 is manufactured. Examples of processes of forming the through parts V in the substrate 100 vary, and a manufacturing method thereof is not limited thereto. A part of the display device 10 can be divided into four unit parts for convenience, such as first through fourth unit parts U1, U2, U3, and U4 shown in FIG. 1.

According to an embodiment, the first through fourth unit parts U1, U2, U3, and U4 are repeatedly arranged in a first direction X and a second direction Y. Each of the first through fourth unit parts U1, U2, U3, and U4 includes an island 101 and connection parts 102.

According to an embodiment, the connection parts 102 that connect four adjacent unit parts, i.e., the first through fourth unit parts U1, U2, U3, and U4, form a closed curve lines CL that surrounds the through parts V.

According to an embodiment, the through parts V, being an area formed by removing one region of the substrate 100, improve the flexibility of the substrate 100 and reduce stress when the substrate 100 is deformed. The widths of the connection parts 102 are less than those of the islands 101.

According to an embodiment, two adjacent unit parts are symmetric to each other. For example, the first unit part U1 is symmetric to the second unit part U2 with respect to a symmetry axis parallel to the first direction X and is also symmetric to the fourth unit part U4 with respect to a symmetry axis parallel to the second direction Y.

According to an embodiment, an angle θ between a direction in which the connection parts 102 extend and the sides of the islands 101 connected to the connection parts 102 is an acute angle. Sides of two adjacent islands 101 connected to one connection part 102 and an extension direction of the one connection part 102 form an acute angle. Thus, the islands 101 can be densely arranged, the lengths of the connection parts 102 can be minimized, and the area of the through parts V can be maximized. In addition, the substrate 100 is stretchable, as shown in FIG. 2.

FIG. 2 illustrates a shape before and after a part of the substrate 100 of the display device 10 extends in the first direction X and the second direction Y.

Referring to FIG. 2, according to an embodiment, when an external force is applied to the substrate 100, all angles between sides of the island 101 connected to one connection part 102 and the connection parts 102 are increased (θ<θ'). Thus, the area of the through parts V increases. Thus, a distance between the islands 101 increases so that the substrate 100 extends in the first direction X and the second direction Y, and thus the two-dimensional or three-dimensional shape of the substrate 100 changes.

According to an embodiment, widths of the connection parts 102 are less than those of the islands 101. Thus, a shape change caused by an angle increase when an external force is applied to the substrate 100 occurs mainly in the connection parts 102, and the shape of the islands 101 does not change even when the substrate 100 extends. Thus, the unit display parts 200 in the islands 101 are stably maintained even when the substrate 100 extends. Thus, the display device 10 can be easily incorporated into a flexible display device, such as a bendable display device, a flexible display device, or a stretchable display device.

According to an embodiment, stretch stress concentrates on a connecting portion of the connection parts 102, when the substrate 100 extends. Thus, the connecting portion of the connection parts 102 includes a curved surface to prevent the connection parts 102 from being torn due to the stretch stress concentrated thereon.

Figure 3:
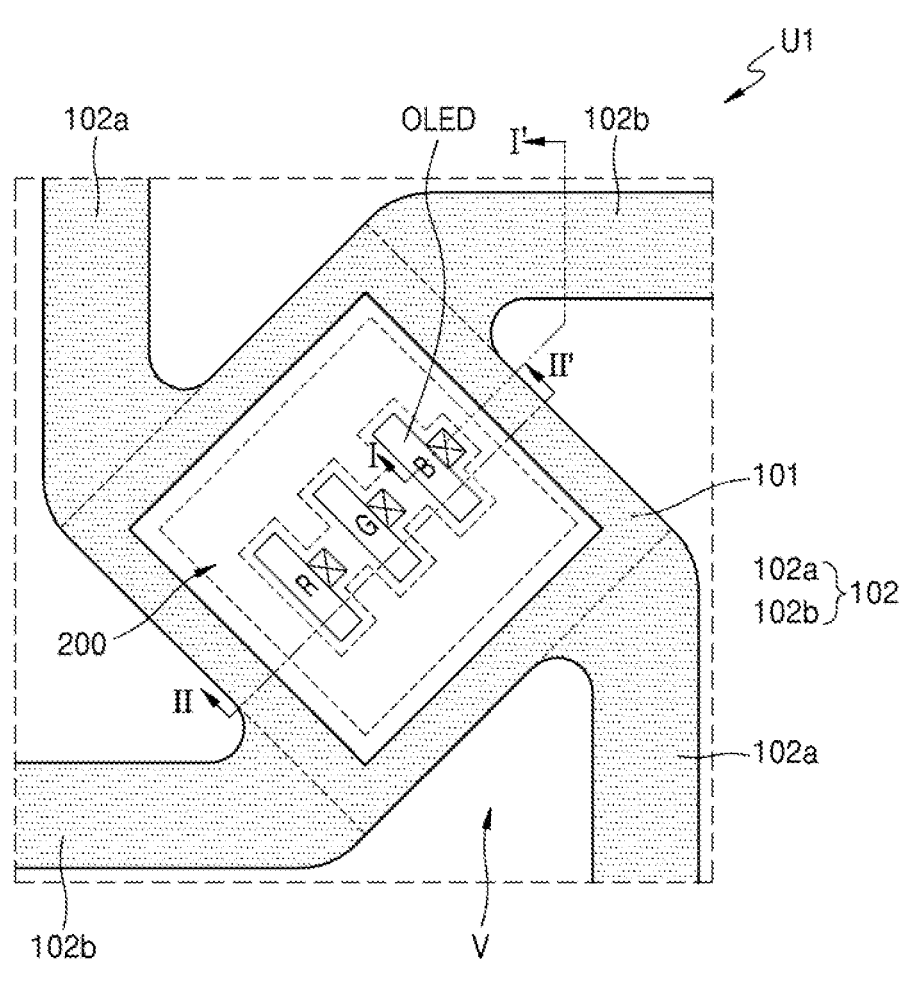
FIG. 3 is a plan view of a first unit part of FIG. 1.
Figure 3:
Figure 4A:
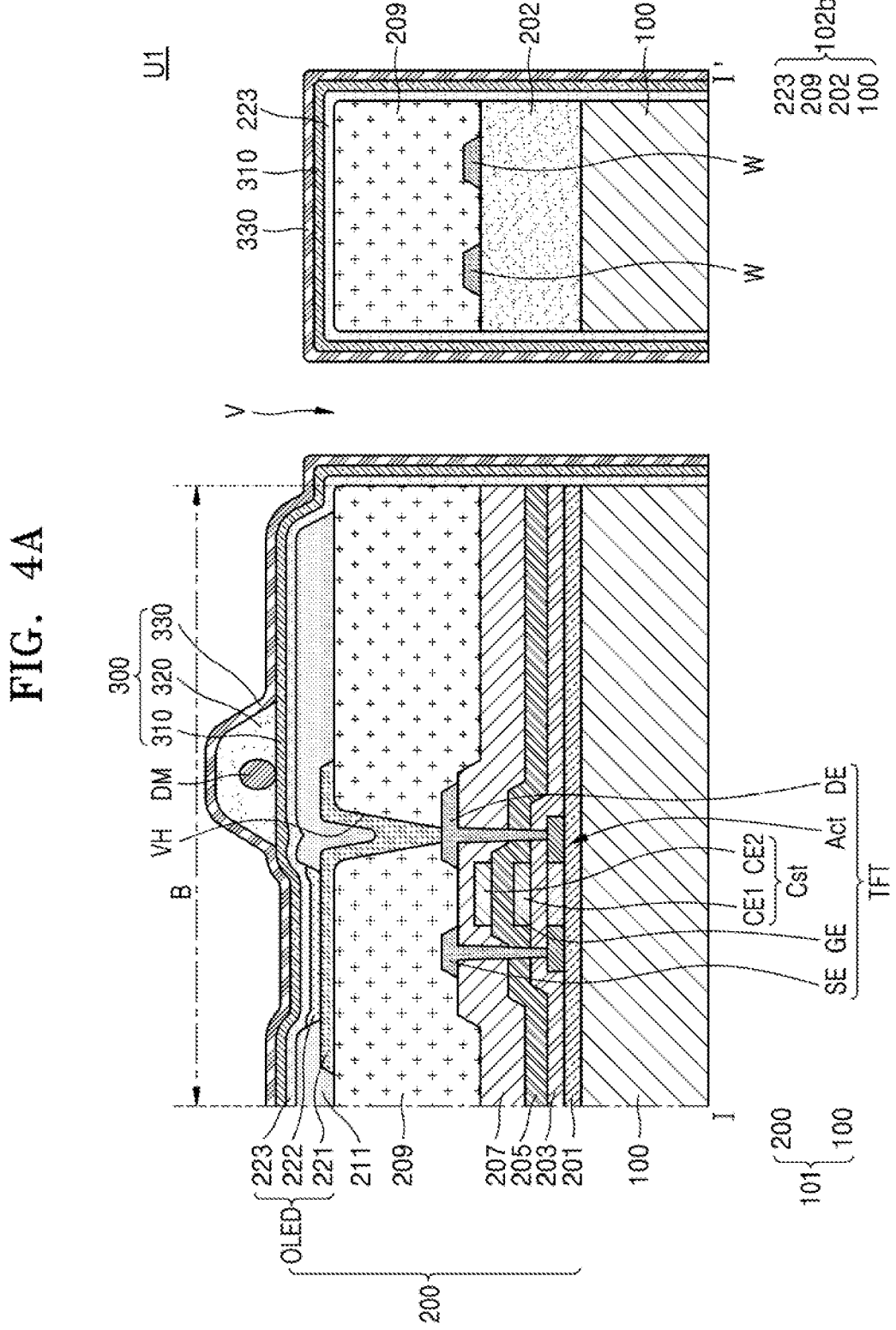
FIG. 4A is a cross-sectional view taken along a line I-I' of FIG. 3.
Figure 4B:
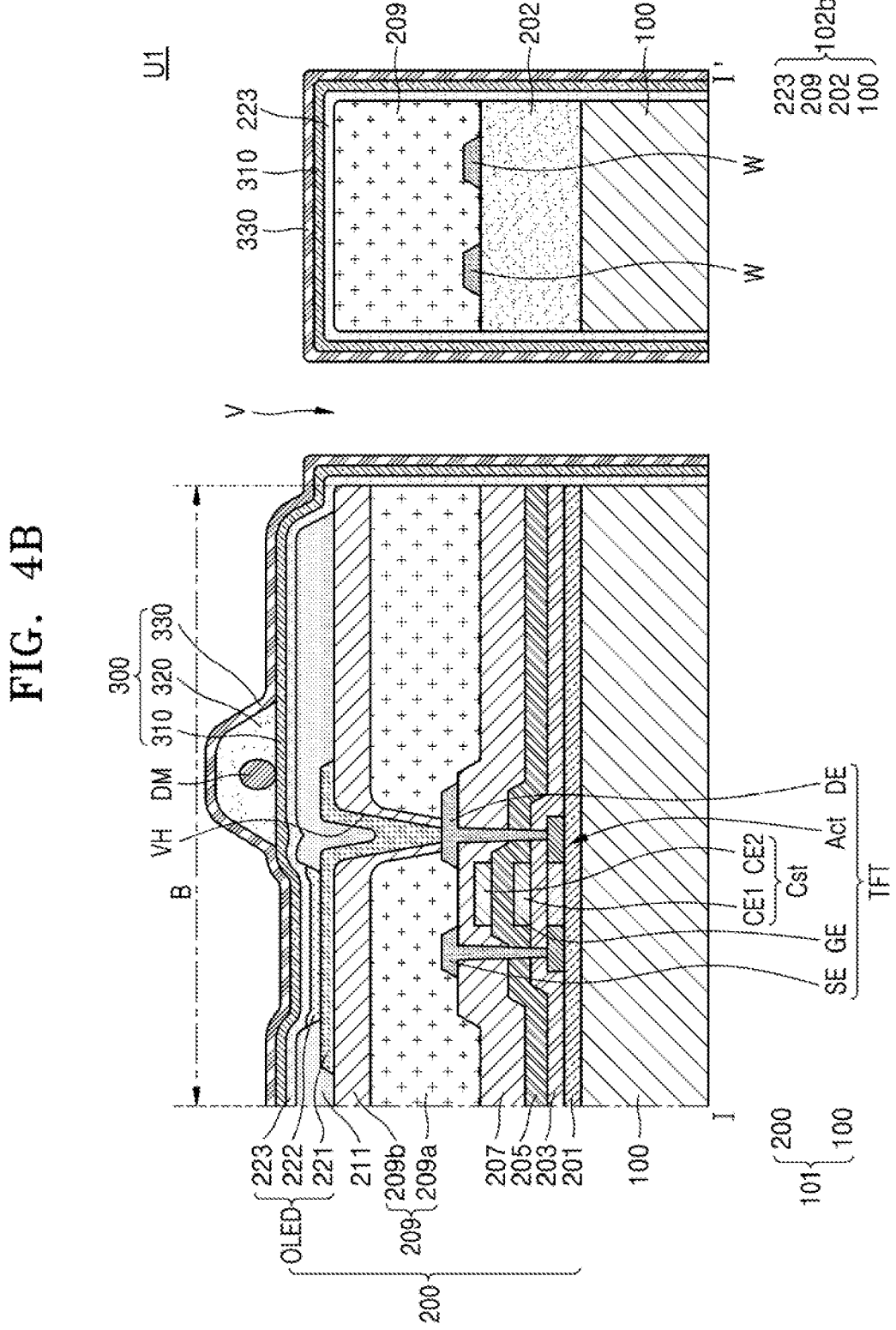
FIG. 4B is another cross-sectional view taken along the line I-I' of FIG. 3.
Figure 5:
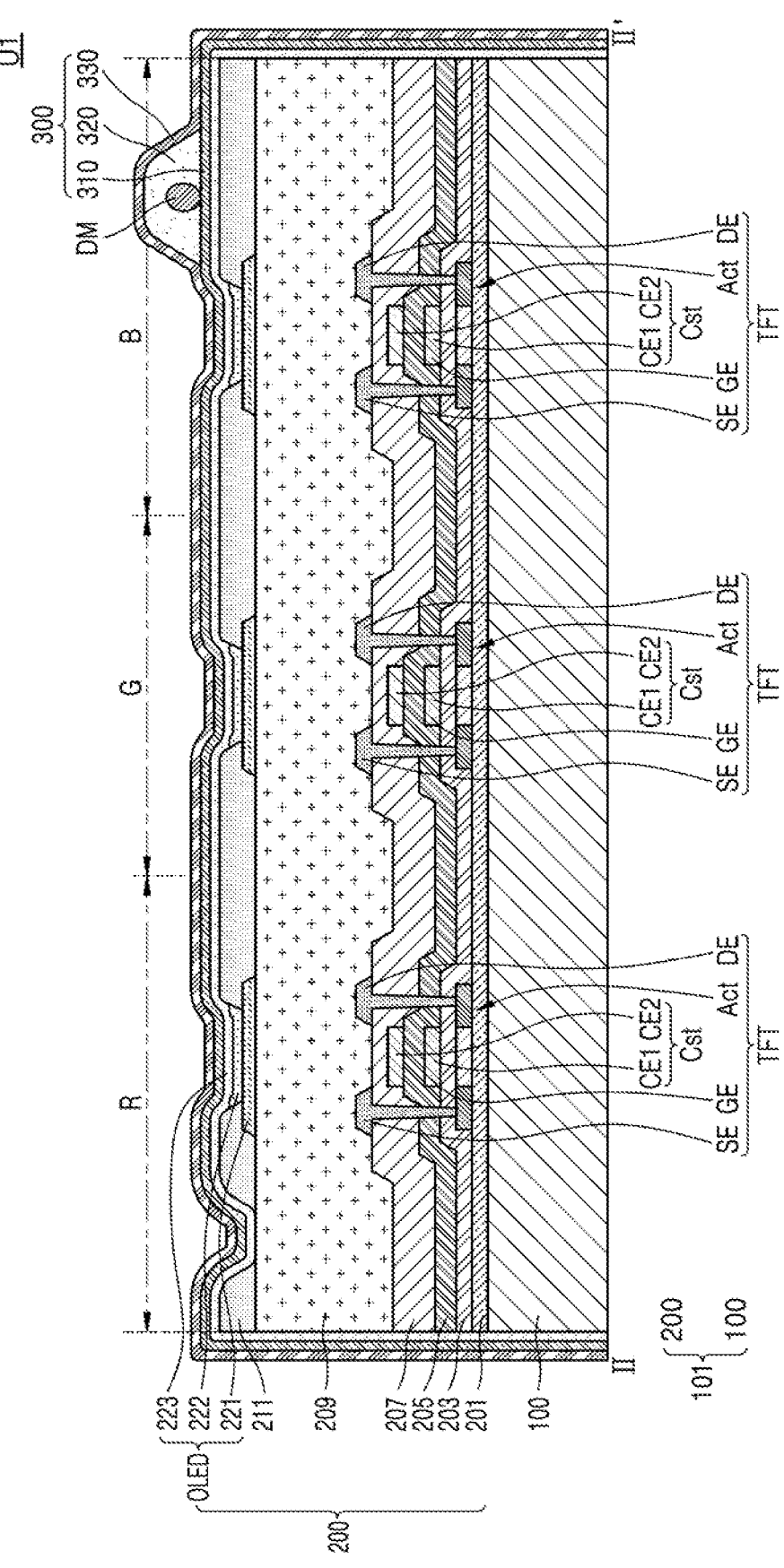
FIG. 5 is a cross-sectional view taken along a line II-II' of FIG. 3.

FIG. 3 is a plan view of the first unit part U1 of FIG. 1, FIG. 4A is a cross-sectional view of the first unit part U1 taken along a line I-I' of FIG. 3, FIG. 4B is a cross-sectional view of another first unit part U1 taken along the line I-I' of FIG. 3, and FIG. 5 is a cross-sectional view taken along a line II-II' of FIG. 3. In FIGS. 3 to 5, the first unit part U1 and a blue sub-pixel that emits blue light are used as examples of a unit part and sub-pixel that contain dust particles, however embodiments are not limited thereto. Any of the unit parts U1 to U4, and any colored sub-pixel may be a unit part or sub-pixel that contains dust material.

Referring to FIGS. 3 through 5, according to an embodiment, the islands 101 and the connection parts 102 are positioned in the first unit part U1.

According to an embodiment, an encapsulation layer 300 that seals the unit display parts 200 is positioned on the islands 101. The connection parts 102 include a pair of first connection parts 102*a* that are positioned at opposite sides of the islands 101 and extend from diagonally opposed corners in a direction parallel to the first direction X and a pair of second connection parts 102*b* that are positioned at opposite sides of the islands 101 and extend from diagonally opposed corners in a direction parallel to the second direction Y.

According to an embodiment, each of the unit display parts 200 includes at least one display element. In an example, the at least one display element is at least one organic light-emitting device OLED that emits red, blue, green, or white light. The organic light-emitting device OLED is electrically connected to a thin-film transistor (TFT). In a current embodiment, the organic light-emitting device OLED will be described as a display element. However, embodiments are not limited thereto. Each of the unit display parts 200 may be one of a variety of types of display elements, such as an inorganic electroluminescent (EL) device, a quantum dot light-emitting device, or a liquid crystal device.

In an embodiment, each of the unit display parts 200 includes a plurality of sub-pixels. For example, one unit display part 200 includes a sub-pixel R that emits red light, a sub-pixel G that emits green light, and a sub-pixel B that emits blue light, as shown in FIG. 3. However, embodiments are not limited thereto. Each of the unit display parts 200 may include more than or fewer than three sub-pixels. In addition, each of the unit display parts 200 may include at least one sub-pixel that emits one light.

In addition, according to an embodiment, the organic light-emitting devices OLED may be arranged within the unit display parts 200 in various arrangements, such as an RGB structure, a Pentile structure, or a honeycomb structure, according to the efficiency of materials included in an organic light-emitting layer.

Referring to FIG. 4A, a display device according to an embodiment includes a substrate 100, a plurality of unit display parts 200 that each include a planarization layer 209, and an encapsulation layer 300 that seals each of the unit display parts 200. The unit display parts 200 are disposed on the substrate 100 of the islands 101, and wirings are disposed on the substrate 100 of the pair of second connection parts 102b. Although the second connection parts 102b are illustrated in FIG. 4A, the structure of the first connection parts 102a are substantially similar to that of the second connection parts 102b.

First, according to an embodiment, the unit display parts 200 disposed on the islands 101 and the encapsulation layer 300 that seals the unit display parts 200 will be described.

According to an embodiment, a buffer layer 201 is formed on the substrate 100 of the islands 101 to prevent impurities from penetrating into a semiconductor layer Act of the thin-film transistor (TFT). The buffer layer 201 includes an inorganic insulating material, such as silicon oxide or silicon nitride, and may have a single layer or multi-layer structure that includes the above-described inorganic insulating materials.

According to an embodiment, a pixel circuit is positioned on the buffer layer 201. The pixel circuit includes at least one TFT and storage capacitor Cst.

According to an embodiment, the TFT includes the semiconductor layer Act, a gate electrode GE, a source electrode SE, and a drain electrode DE. In a current embodiment, a top gate type TFT in which the gate electrode GE is above the semiconductor layer Act with a gate insulating layer 203 between the gate electrode GE and the semiconductor layer Act is shown. However, according to another embodiment, the TFT is a bottom gate type TFT.

According to an embodiment, the semiconductor layer Act includes polysilicon. Alternatively, in other embodiments, the semiconductor layer Act includes amorphous silicon, an oxide semiconductor, or an organic semiconductor.

According to an embodiment, the gate electrode GE includes a low-resistivity metal. In addition, the gate electrode GE includes a conductive material that includes one of molybdenum (Mo), aluminum (Al), copper (Cu), or titanium (Ti), and may have a multi-layer or single layer structure that includes the above-described materials.

According to an embodiment, the gate insulating layer 203 between the semiconductor layer Act and the gate electrode GE includes an inorganic insulating material, such as silicon oxide, silicon nitride, silicon oxynitride, aluminum oxide, titanium oxide, tantalum oxide, or hafnium oxide. The gate insulating layer 203 may have a single layer or multi-layer structure that includes the above-described materials.

According to an embodiment, the source electrode SE and the drain electrode DE include a material having good conductivity. The source electrode SE and the drain electrode DE include a conductive material, such as Mo, Al, Cu, or Ti, and may have a multi-layer or single layer structure that includes the above-described materials. In an embodiment, the source electrode SE and the drain electrode DE have a Ti/Al/Ti multi-layer structure.

According to an embodiment, the storage capacitor Cst includes a lower electrode CE1 and an upper electrode CE2 that overlap each other with a first interlayer insulating layer 205 therebetween. The storage capacitor Cst overlaps the TFT. In this regard, in FIG. 4A, the gate electrode GE of the TFT is the lower electrode CE1 of the storage capacitor Cst. In another embodiment, the storage capacitor Cst does not overlap the TFT. The storage capacitor Cst is covered with a second interlayer insulating layer 207.

According to an embodiment, the first and second interlayer insulating layers 205 and 207 include an inorganic insulating material, such as silicon oxide, silicon nitride, silicon oxynitride, aluminum oxide, titanium oxide, tantalum oxide, or hafnium oxide. The first and second interlayer insulating layers 205 and 207 may have a single layer or multi-layer structure that includes the above-described materials.

According to an embodiment, the pixel circuit that includes the TFT and the storage capacitor Cst is covered with the planarization layer 209.

According to an embodiment, the planarization layer 209 removes step differences caused by the TFT, and a top surface of the planarization layer 209 is planarized so that defects can be prevented from occurring in the organic light-emitting device OLED due to unevenness in the underlying layers.

According to an embodiment, the planarization layer 209 includes an organic insulating material, such as a general-purpose polymer, such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the planarization layer 209 includes polyimide.

In another embodiment, the planarization layer 209 includes an inorganic insulating material, such as silicon oxide, silicon nitride, silicon oxynitride, aluminum oxide, titanium oxide, tantalum oxide, or hafnium oxide.

In another embodiment, the planarization layer 209 has a structure in which an organic insulating layer and an inorganic insulating layer are stacked on one another.

FIG. 4B is a cross-sectional view of another example of a first unit part U! taken along the line I-I' of FIG. 3. Referring to FIG. 4B, the planarization layer 209 includes an organic planarization layer 209a and an inorganic planarization layer 209b positioned on the organic planarization layer 209a.

According to an embodiment, to form the planarization layer 209, a mask process and a development process are performed so that, after a liquefied organic material is applied to cover the TFT, via holes VH that expose the drain electrode DE of the TFT are formed. In this way, the planarization layer 209 is formed by curing the liquefied organic material. Thus, the top surface of the planarization layer 209 is substantially flat.

According to an embodiment, a pixel electrode 221 is formed on a flat surface of the planarization layer 209. The pixel electrode 221 includes a conductive material, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 includes a metal layer that includes one of silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 further includes a layer that includes one of ITO, IZO, zinc oxide, or indium oxide on or under the above-described metal layers.

According to an embodiment, a pixel-defining layer 211 is formed on the pixel electrode 221 and the flat surface of the planarization layer 209. The pixel-defining layer 211 includes an opening that exposes the top surface of the pixel electrode 221 and covers edges of the pixel electrode 221. Thus, the pixel-defining layer 211 defines an emission area of a pixel.

According to an embodiment, the pixel-defining layer 211 includes an organic insulating material. Alternatively, in other embodiments, the pixel-defining layer 211 includes an inorganic insulating material, such as silicon nitride (SiNx), silicon oxynitride (SiON), or silicon oxide (SiOx). Alternatively, in still other embodiments, the pixel-defining layer 211 includes an organic insulating material and an inorganic insulating material.

According to an embodiment, the organic light-emitting device OLED includes an intermediate layer 222 that includes a small molecular weight material or polymer material.

When the intermediate layer 222 includes a small molecular weight material, the intermediate layer 222 has a structure in which a hole injection layer (HIL), a hole transport layer (HTL), an emission layer (EML), an electron transport layer (ETL), and an electron injection layer (EIL) are stacked on each other in a single or composite structure. The intermediate layer 222 includes at least one of a variety of organic materials, such as copper phthalocyanine (CuPc), N,N'-Di(naphthalene-1-yl)-N,N'-diphenyl-benzidine (NPB), or tris-8-hydroxyquinoline aluminum)(Alq3). These layers are formed by a method such as vapor deposition.

According to an embodiment, when the intermediate layer 222 includes a polymer material, the intermediate layer 222 has a structure that includes an HTL and an EML. In this case, the HTL includes polyethylenedioxythiphene (PE-DOT), and the EML includes a poly-phenylenevinylene (PPV)-based polymer material and a polyfluorene-based polymer material. The intermediate layer 222 is formed by screen printing or inkjet printing, or laser induced thermal imaging (LITI).

Of course, embodiments are not limited thereto, and in other embodiments, the intermediate layer 222 has other structures. The intermediate layer 222 may include layers integrally connected to each other over a plurality of pixel electrodes 221, or a patterned layer that corresponds to each of the plurality of pixel electrodes 221.

According to an embodiment, the organic light-emitting device OLED includes an opposite electrode 223 that includes a conductive material that has a small work function. For example, the opposite electrode 223 includes a metal layer that includes one of Ag, Mg, Al, Pt, Pd, Au, Ni, Nd, Ir, Cr, Li, Ca, or an alloy thereof. Alternatively, in other embodiments, the opposite electrode 223 further includes a layer such as ITO, IZO, ZnO, or In₂O₃, which is formed on the metal layer that includes the above-described materials. The opposite electrode 223 is also formed on both the unit display parts 200 and the second connection parts 102*b*, which is a non-display area.

According to an embodiment, the intermediate layer 222 and the opposite electrode 223 are formed by thermal deposition. The opposite electrode 223 is formed on the entire surface of the substrate 100 and thus can be deposited onto sides of the through parts V.

According to an embodiment, a capping layer that protects the opposite electrode 223 is further positioned on the opposite electrode 223. The capping layer includes one of LiF, an inorganic material, or an organic material.

According to an embodiment, an encapsulation layer 300 that seals the unit display part 200 is formed on the opposite electrode 223. The encapsulation layer 300 blocks external oxygen and moisture and may have a single layer or multi-layer structure. In a current embodiment, the encapsulation layer 300 includes at least two inorganic encapsulation layers, such as first and second inorganic encapsulation layers 310 and 330, and an organic encapsulation layer 320. The organic encapsulation layer 320 is not formed on the entirety of the display device but only in a partial area in which dust material DM is located.

According to an embodiment, the first inorganic encapsulation layer 310 and the second inorganic encapsulation layer 330 include one or more inorganic insulating materials, such as aluminum oxide, titanium oxide, tantalum oxide, hafnium oxide, zinc oxide, silicon oxide, silicon nitride, or silicon oxynitride, and are formed by chemical vapor deposition (CVD).

According to an embodiment, the organic encapsulation layer 320 includes one of PMMA, polycarbonate (PC), PS, acryl-based resin, epoxy-based resin, polyimide, polyethylene, polyethylenesulphonate, polyoxymethylene, polyarylate, or hexamethyldisiloxane (HMDSO).

Hereinafter, a step difference compensation layer 202 positioned in the second connection parts 102*b* and structures positioned on the step difference compensation layer 202 will be described. Note that although the second connection parts 102*b* are illustrated in FIG. 4B, the structure of the first connection parts 102*a* are substantially similar to that of the second connection parts 102*b*.

According to an embodiment, the step difference compensation layer 202 is disposed on the substrate 100 of the second connection parts 102*b*. Widths of the second connection parts 102*b* are less than those of the islands 101. Thus, the second connection parts 102*b* are weaker to stress that occurs when deforming the shape of the display device. Thus, one or more of the buffer layer 201, the gate insulating layer 203, the first interlayer insulating layer 205, or the second interlayer insulating layer 207 is not formed on the substrate 100 of the second connection parts 102*b*. This minimizes the occurrence of defects (cracks) of an inorganic layer due to deformation of the connection parts.

In a present embodiment, the buffer layer 201, the gate insulating layer 203, the first interlayer insulating layer 205, and the second interlayer insulating layer 207, which are inorganic layers formed on the substrate 100 of the islands 101, are removed by a process such as etching, and instead, a step difference compensation layer 202 is deposited that includes an organic material.

According to an embodiment, wirings W that transmit voltages or signals to the unit display parts 200 are positioned on the step difference compensation layer 202, and the step difference compensation layer 202 absorbs stress that may be applied to the wirings W by preventing height differences when the wirings W are connected to the islands 101.

According to an embodiment, the step difference compensation layer 202 includes at least one organic insulating material, such as polyimide, polyamide, acryl resin, benzocyclobutene, HMDSO, or phenol resin. The step difference compensation layer 202 may have a single layer or multi-layer structure that includes these organic insulating materials.

According to an embodiment, the wirings W positioned on the step difference compensation layer 202 include the same material as that used to form the source electrode SE or the drain electrode DE of the TFT positioned in the islands 101. Alternatively, in other embodiments, the wirings W include the same material as that used to form the gate electrode GE of the TFT. The wirings W include wirings that transmit voltages or signals to the pixel circuit.

According to an embodiment, the wirings W are covered with the planarization layer 209. In an embodiment, the planarization layer 209 of the second connection parts 102*b* includes the same material as that used to form the planarization layer 209 of the islands 101.

According to an embodiment, the opposite electrode 223, the first inorganic encapsulation layer 310, and the second inorganic encapsulation layer 330 are stacked on the planarization layer 209. Because the opposite electrode 223, the first inorganic encapsulation layer 310, and the second inorganic encapsulation layer 330 are formed using an open mask after the through parts V are formed, the opposite electrode 223, the first inorganic encapsulation layer 310, and the second inorganic encapsulation layer 330 cover sides of the through parts V.

In a present embodiment, the organic encapsulation layer 320 of the encapsulation layer 300 is not formed on the entirety of the display device but is formed on a partial area that contains dust material DM.

For example, according to an embodiment, as shown in FIG. 5, the first inorganic encapsulation layer 310 and the second inorganic encapsulation layer 330 are formed to cover the entirety of the unit display parts 200. However, the organic encapsulation layer 320 is concentrated in a region of the sub-pixel B of the unit display parts 200 in which there is dust material DM and which emits blue light. According to an embodiment, the organic encapsulation layer 320 is not formed in sub-pixel regions other than the sub-pixel region in which there is dust material DM. However, embodiments are not limited thereto.

Figure 6:
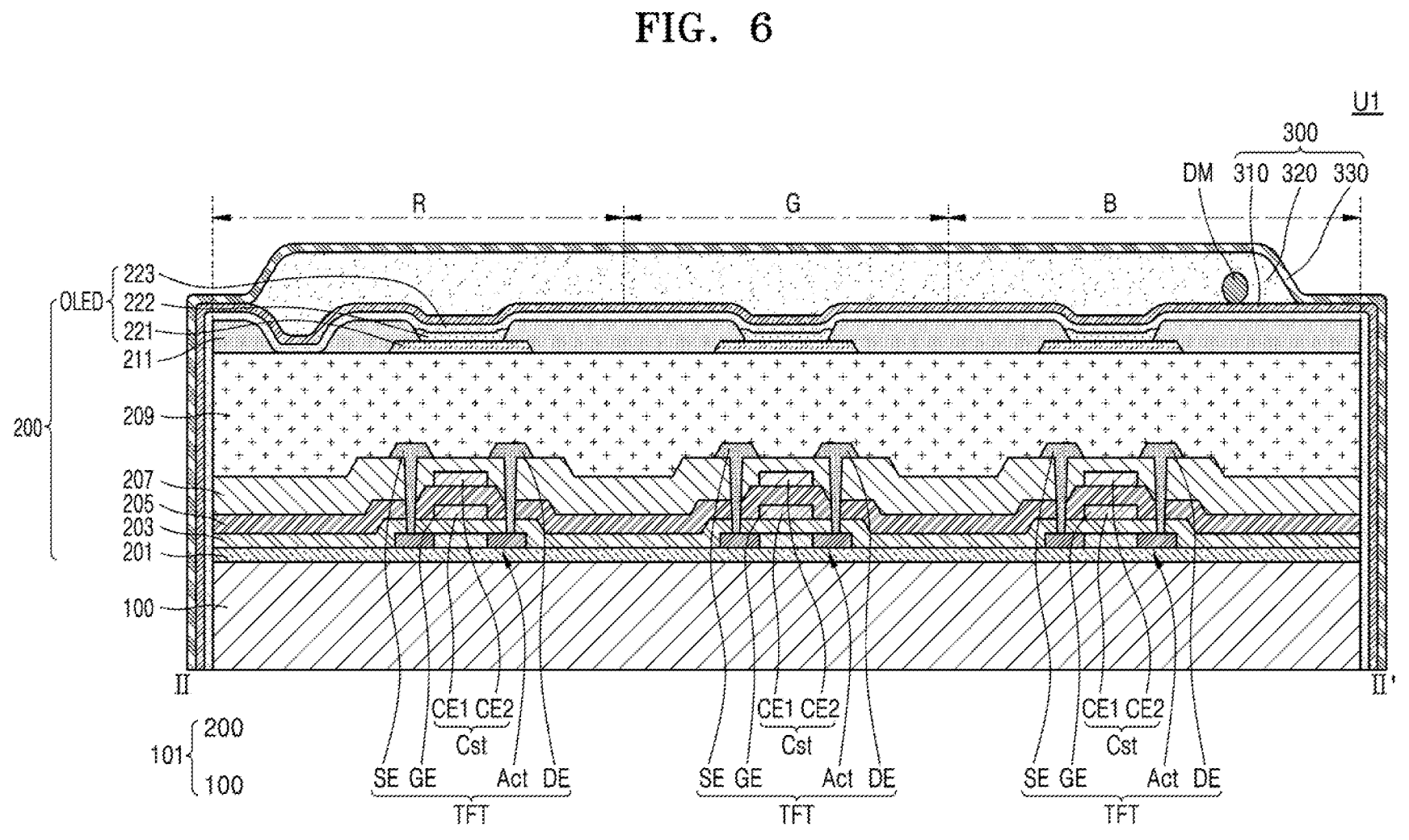

In another embodiment, the organic encapsulation layer 320 is formed on the entirety of the unit display parts 200, as shown in FIG. 6.

Referring to FIG. 6, according to an embodiment, the dust material DM is present only in the sub-pixel B that emits blue light, as shown in FIG. 5. However, the organic encapsulation layer 320 is not concentrated in the sub-pixel B that emits blue light and in which there is dust material DM, but is formed with substantially the same thickness on the sub-pixel R that emits red light and the sub-pixel G that emits green light. In this case, the first inorganic encapsulation layer 310 and the second inorganic encapsulation layer 330 are also formed on all of the red sub-pixel R, the green sub-pixel G, and the blue sub-pixel B.

In addition, according to an embodiment, even when the organic encapsulation layer 320 is formed on all of the islands 101 of the first unit display part U1 due to the presence of dust material DM, as shown in FIG. 6, the organic encapsulation layer 320 is not formed in islands 101 of the second through fourth unit parts U2, U3, and U4 that do not contain dust material DM.

Figure 7:
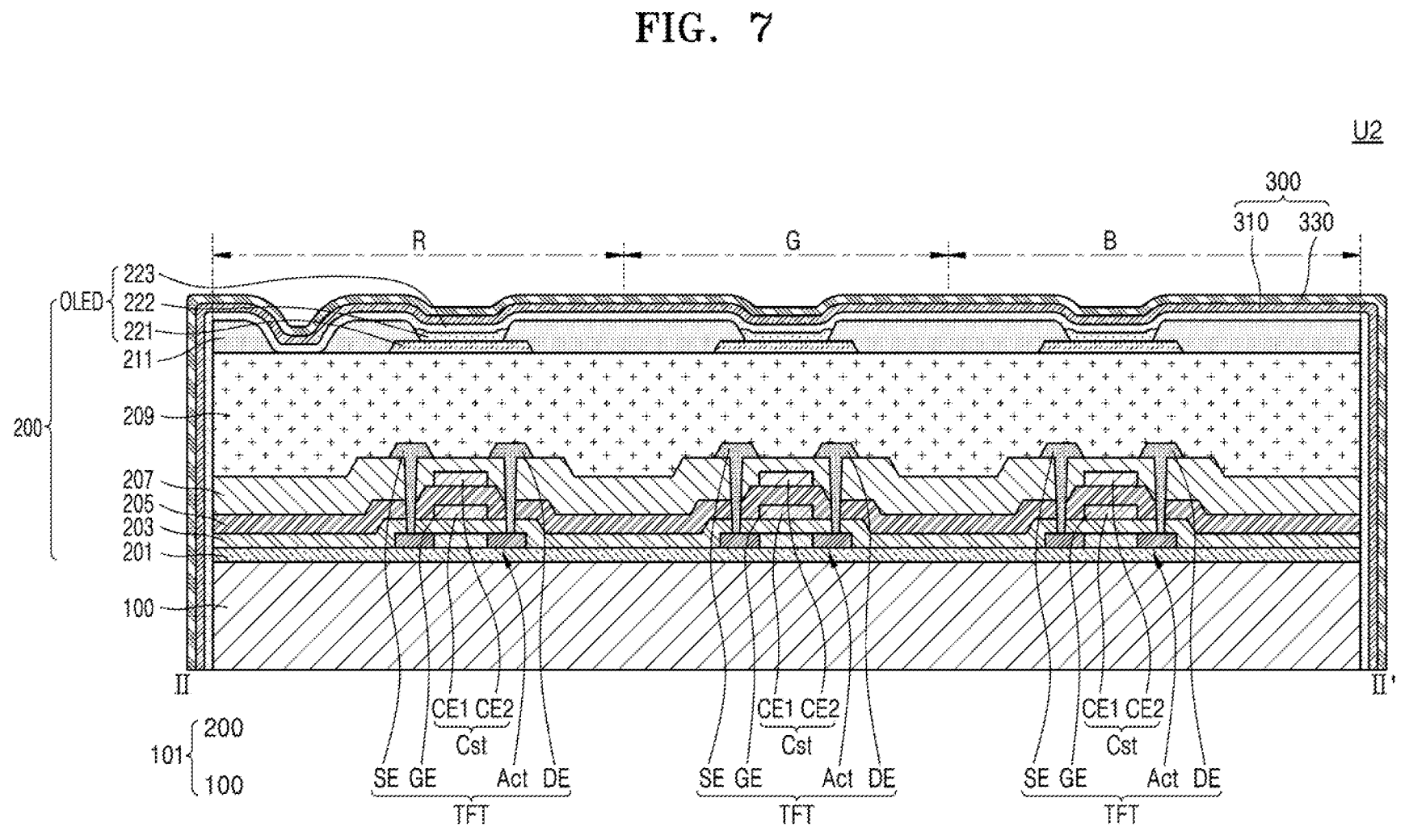

FIG. 7 is a cross-sectional view of a part of the second unit part U2 in which there is no dust material. In FIG. 7, the encapsulation layer 300 includes only the first inorganic encapsulation layer 310 and the second inorganic encapsulation layer 330 without provision of the organic encapsulation layer 320.

Referring to FIGS. 5 and 7 or FIGS. 6 and 7, according to an embodiment, an encapsulation layer 300 that includes the first inorganic encapsulation layer 310 and the second inorganic encapsulation layer 330 but not the organic encapsulation layer 320 is formed in the islands 101 of the second unit part U2 in which there is no dust material DM However, the encapsulation layer formed in the islands 101 of the first unit part U1 in which there is dust material DM includes an organic encapsulation layer 320 concentrated in a partial region in which there is dust material DM, such as the region of the sub-pixel B, or the encapsulation layer that includes an organic encapsulation layer 320 is formed on the entirety of the first unit part U1.

According to an embodiment, is the organic encapsulation layer 320 is formed on all of islands 101, the organic encapsulation layer 320 is printed on each of the islands 101, whereas, in a current embodiment, the organic encapsulation layer 320 is formed only in the first unit part U1 or in a required region of the first unit part U1, so that a process time can be reduced as compared to a process of forming the organic encapsulation layer 320 on all of the islands 101.

According to an embodiment, when only the first and second inorganic encapsulation layers 310 and 330 are formed in a region in which there is dust material DM, the first and second inorganic encapsulation layers 310 and 330 weakly cover the dust material DM so that gaps can form at the edges of the dust material DM through which oxygen and moisture can penetrate. However, in a current embodiment, the organic encapsulation layer 320 covers the region in which there is dust material DM, so that penetration of oxygen and moisture may be prevented.

In a current embodiment, the organic encapsulation layer 320 is positioned on the islands 101 but not on the connection parts 102. Thus, the first inorganic encapsulation layer 310 and the second inorganic encapsulation layer 330 are in contact with each other at an outer portion of the organic encapsulation layer 320, beyond an edge of the organic encapsulation layer 320, so that each unit display part 200 is individually encapsulated.

According to an embodiment, the first inorganic encapsulation layer 310 and the second inorganic encapsulation layer 330 are formed on the entire surface of the substrate 100 by using CVD. Thus, the first inorganic encapsulation layer 310 and the second inorganic encapsulation layer 330 cover the sides of the through parts V.

According to an embodiment, the organic encapsulation layer 320 is formed by applying a predetermined amount of a liquefied organic material using inkjet printing or three-dimensional (3D) printing to correspond to the unit display parts 200 and then by curing the liquefied organic material.

Figure 8:
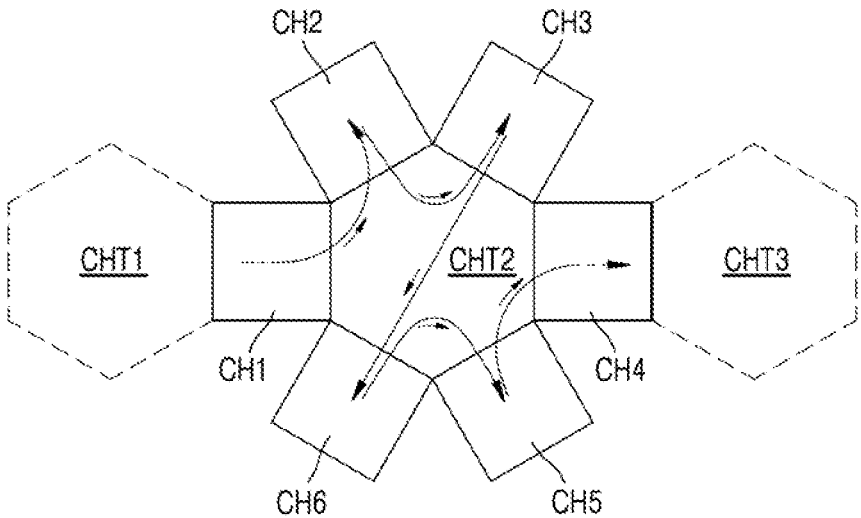
FIG. 8 schematically illustrates a manufacturing process according to an embodiment.
Figure 9:
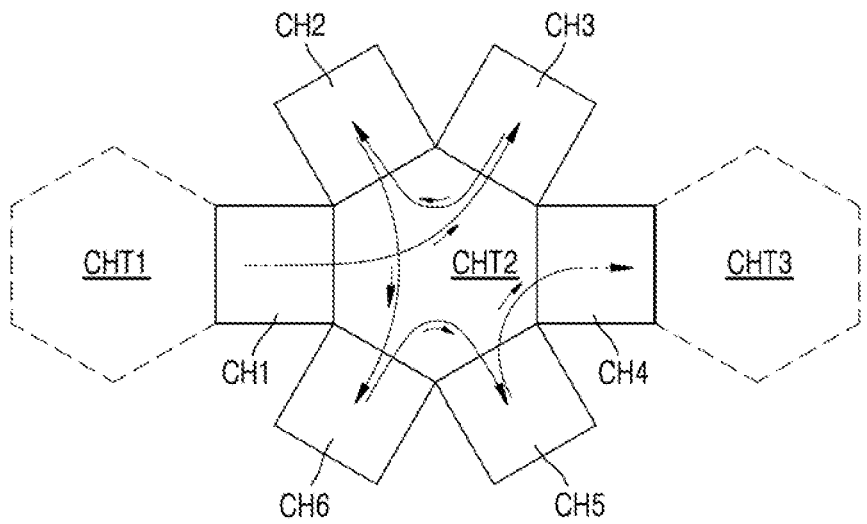
FIG. 9 schematically illustrates a manufacturing process according to another embodiment.

FIGS. 8 and 9 schematically illustrate a process of detecting dust material DM and forming an encapsulation layer 300.

Referring to FIG. 8, according to an embodiment, a display device that includes the intermediate layer 222 and the opposite electrode 223 is transferred from a first transfer chamber CHT1 to a second transfer chamber CHT2 via a transfer chamber CH1 to form the first inorganic encapsulation layer 310.

According to an embodiment, the display device in the second transfer chamber CHT2 is then transported to the first chamber CH2 so that the first inorganic encapsulation layer 310 can be formed. The first inorganic encapsulation layer 310 is formed using CVD.

According to an embodiment, after the first inorganic encapsulation layer 310 is formed, the display device is transferred to an inspection chamber CH3. The inspection chamber CH3 inspects the display device to detect dust material DM using automatic optical inspection (AOI) to record coordinate information about a pixel that contains dust material DM.

According to an embodiment, after dust material DM is detected, the display device is transported to the second chamber CH6, and the second chamber CH6 forms an organic encapsulation layer 320. By using the coordinate information of the dust material DM obtained by the inspection chamber CH3, the organic encapsulation layer 320 is applied by using inkjet printing or 3D printing to correspond to a region that contains the dust material DM, and is then cured.

According to an embodiment, after forming the organic encapsulation layer 320, the display device is transported to a third chamber CH5, and a second inorganic encapsulation layer 330 is formed by the third chamber CH5. The second inorganic encapsulation layer 330 is formed by using CVD.

According to an embodiment, after the second inorganic encapsulation layer 330 is formed, the display device is transferred to the third transfer chamber CHT3 in which a subsequent process is performed.

For example, the subsequent process involves detaching a glass base substrate that is seated on a lower portion of the substrate 100 from the substrate 100.

Referring to FIG. 9, according to an embodiment, when comparing FIG. 9 with FIG. 8, the sequence of inspecting the dust material DM and forming the first inorganic encapsulation layer 310 is changed.

According to an embodiment, the display device transferred to the second transfer chamber CHT2 is first transferred to the inspection chamber CH3, which detects dust material DM using AOI and records coordinate information about a pixel that contains the dust material DM. That is, the dust material DM is detected before the first inorganic encapsulation layer 310 is formed.

According to an embodiment, after the inspection process is performed, the display device is transported to the first chamber CH2 to form the first inorganic encapsulation layer 310, and after the first inorganic encapsulation layer 310 is formed, the display device is transported to the second chamber CH6, and an organic encapsulation layer 320 is applied using inkjet printing or 3D printing to correspond to a region that contains the dust material DM, and then is cured.

According to an embodiment, after the organic encapsulation layer 320 is formed, the display device is transported to the third chamber CH5, and a second inorganic encapsulation layer 330 is formed by the third chamber CH5. The second inorganic encapsulation layer 330 is formed by using CVD.

According to an embodiment, after the second inorganic encapsulation layer 330 is formed, the display device is transferred to the third transfer chamber CHT3 so that a subsequent process can be performed.

As described above, according to an embodiment, before the organic encapsulation layer 320 is formed, the display device is inspected to detect dust material DM, and if detected, the coordinate information of the dust material DM is used to form the organic encapsulation layer 320 only in the unit display parts 200 that contain dust material DM, so that a process time can be reduced. In addition, the organic encapsulation layer 320 is covered to block penetration of impurities and improve the reliability of the encapsulation layer.

In addition, according to an embodiment, in FIG. 8, an inspection process is performed once after the first inorganic encapsulation layer 310 is formed, and in FIG. 9, an inspection process is performed once before the first inorganic encapsulation layer 310 is formed. However, embodiments are not limited thereto. In other embodiments, the inspection process is performed twice, i.e., before and after the first inorganic encapsulation layer 310 is formed.

Figure 10:
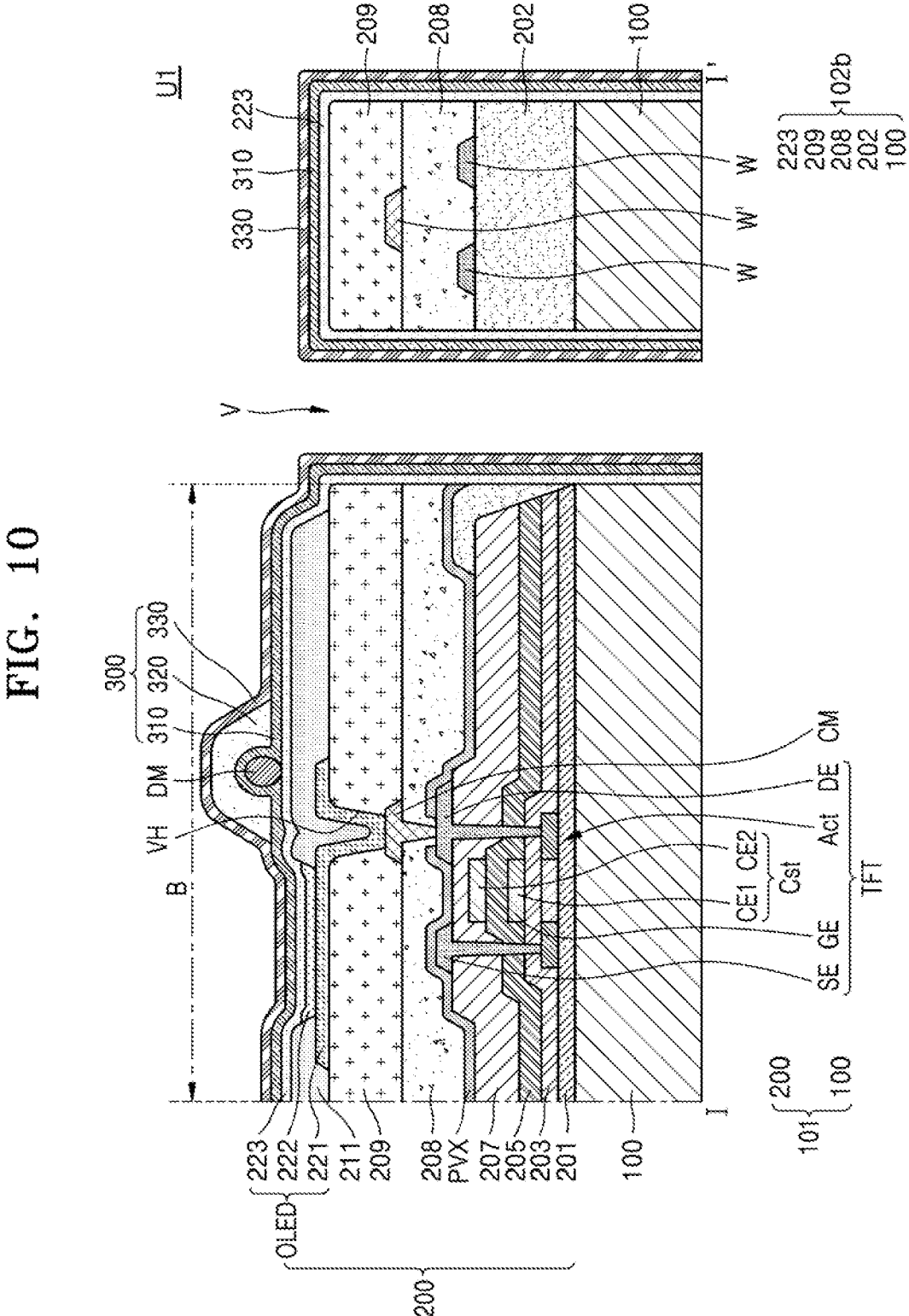
FIG. 10 is a cross-sectional view that illustrates another embodiment of the first unit part.

FIG. 10 is a cross-sectional view of another embodiment of the first unit part U1, which illustrates a case where the dust material DM is present between the opposite electrode 223 and the first inorganic encapsulation layer 310.

As shown in FIG. 8, the coordinate information about the dust material DM is obtained after the first inorganic encapsulation layer 310 is formed. However, the coordinate information of the dust material DM can be obtained from an inspection process before the first inorganic encapsulation layer 310 is formed, as shown in FIG. 9.

Before the first inorganic encapsulation layer 310 is formed on the opposite electrode 223, the display device is inspected to detect dust material DM, and coordinate information about a pixel that contains dust material DM is recorded. Then, the first inorganic encapsulation layer 310 is formed, and then, the organic encapsulation layer 320 is formed in a region that contains dust material DM. Dust material DM between the opposite electrode 223 and the first inorganic encapsulation layer 310 is covered by the organic encapsulation layer 320 to prevent cracks from occurring when the dust material DM and the second inorganic encapsulation layer 330 are in direct contact with each other.

Figure 11:
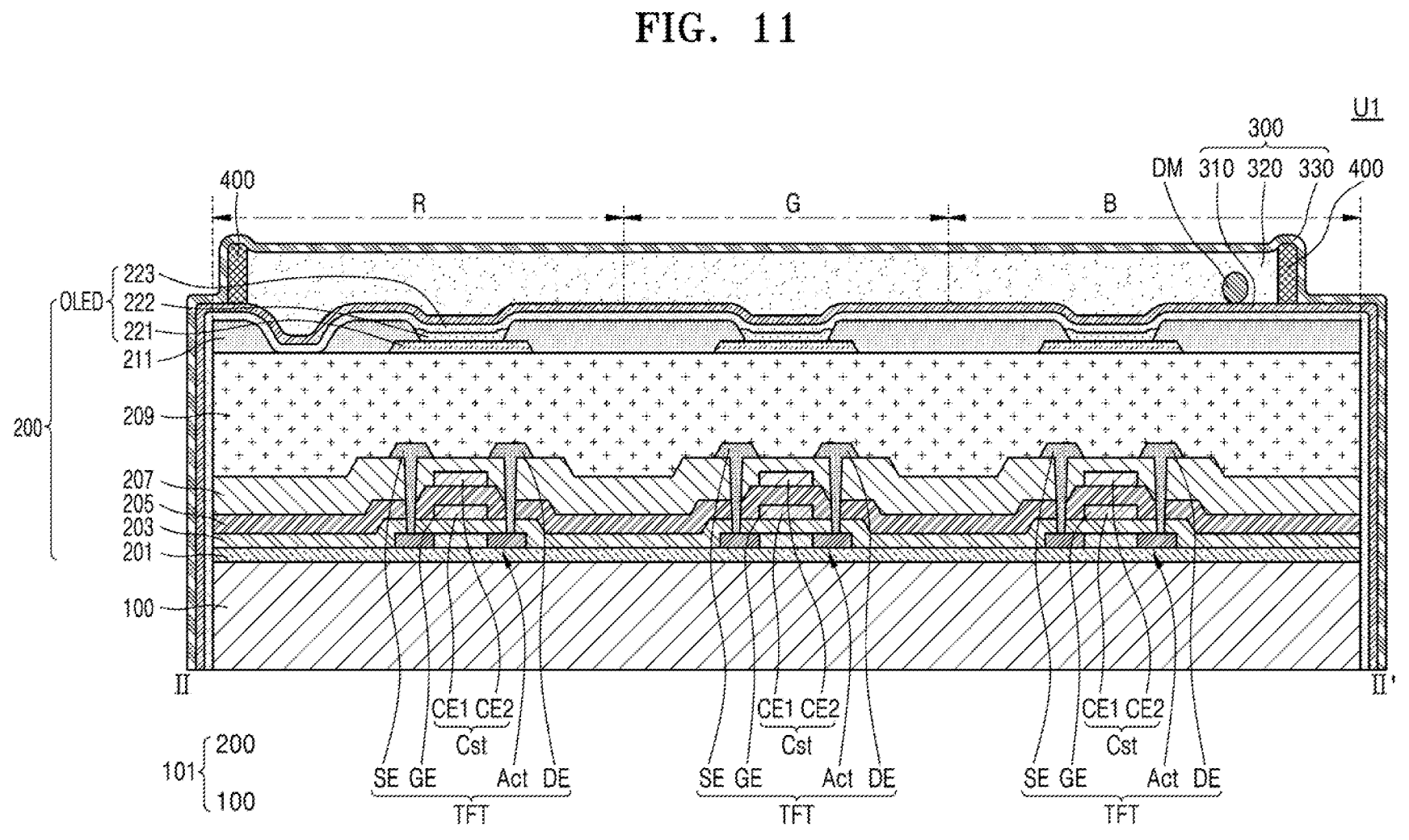

FIG. 11 is a cross-sectional view that illustrates another embodiment of the first unit part U1.

Referring to FIG. 11, according to an embodiment, when comparing FIG. 11 with an embodiment of FIG. 6, in addition to the organic encapsulation layer 320 formed on the entirety of the unit display parts 200, a dam part 400 is formed at edges of the unit display parts 200.

According to an embodiment, the dust material DM is present in the sub-pixel B that emits blue light, as shown in FIG. 5. However, the organic encapsulation layer 320 is formed in all of the blue sub-pixel B that contains dust material DM, the red sub-pixel R, and green the sub-pixel G. In this case, the first inorganic encapsulation layer 310 and the second inorganic encapsulation layer 330 are formed in all of the red sub-pixel R, the green sub-pixel G, and the blue sub-pixel B.

In a present embodiment, the dam part 400 is formed on an upper portion of the first inorganic encapsulation layer 310.

According to an embodiment, the intermediate layer 222 and the opposite electrode 223 are formed by depositing a material using a metallic pattern mask. When the dam part 400 is formed on the pixel-defining layer 211 in a process of depositing the intermediate layer 222 and the opposite electrode 223, the dam part 400 can physically contact the metallic pattern mask.

According to an embodiment, when the dam part 400 is formed of an organic material, the surface of the dam part 400 becomes rough due to contact with the metallic pattern mask. Thus, the surface coverage of the dam part 400 with respect to the first inorganic encapsulation layer 310 is lowered so that impurities may penetrate into the surface of the dam part 400. On the other hand, when the dam part 400 is formed of an inorganic material, the dam part 400 may be damaged by the metallic pattern mask.

However, in a present embodiment, since the dam part 400 is formed after the process of forming the first inorganic encapsulation layer 310, which uses the metallic pattern mask, is finished, the above-described situation does not occur.

Figure 12:
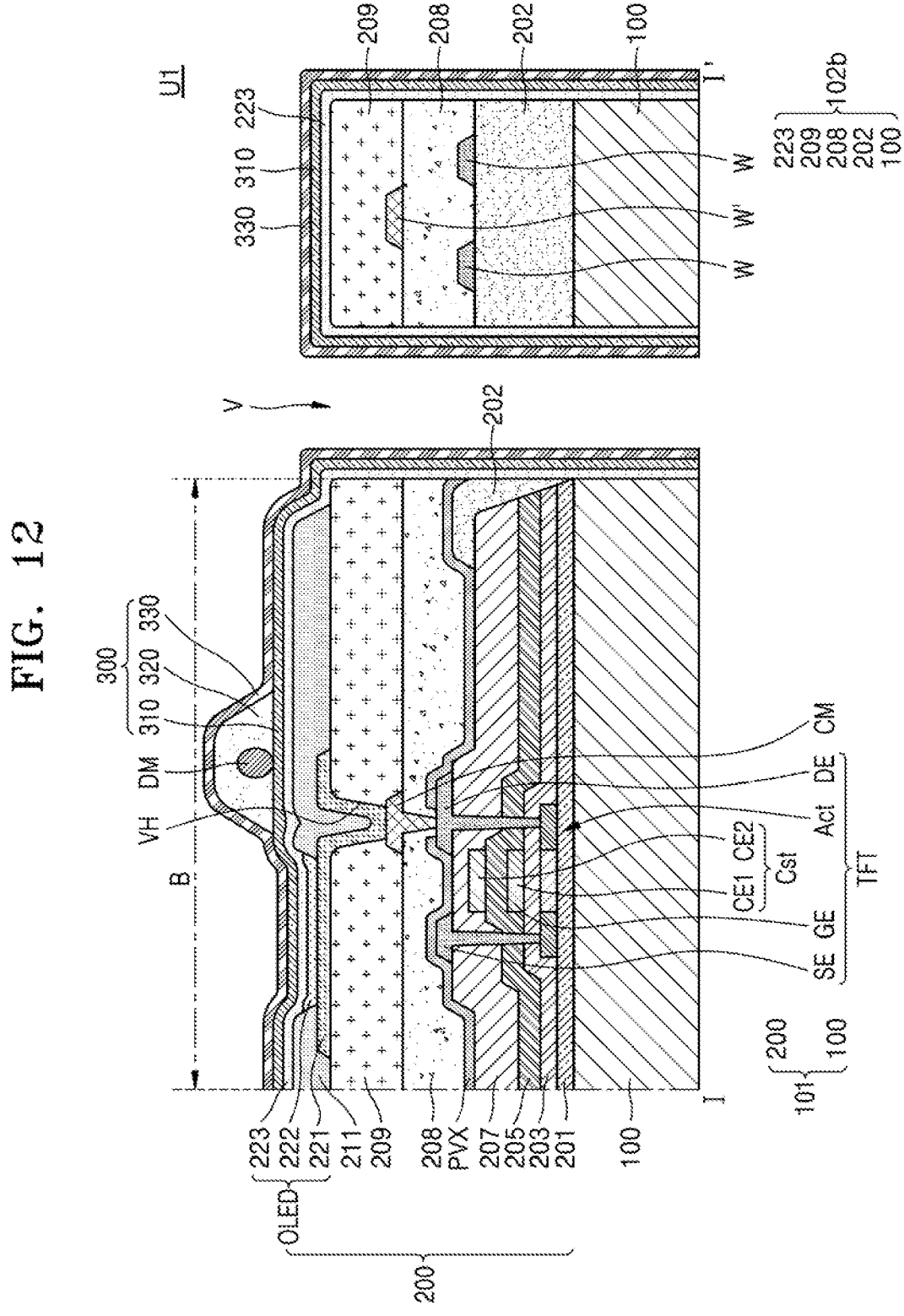
FIG. 12 is a cross-sectional view that illustrates a part of a display device according to another embodiment.

FIG. 12 is a cross-sectional view that illustrates a display device according to another embodiment. The cross section of FIG. 12 corresponds to the line I-I' of FIG. 3.

In FIG. 12, reference numerals that duplicate those in FIGS. 3 and 4A refer to like elements. Thus, a redundant description thereof will be omitted.

Referring to FIG. 12, a display device according to an embodiment includes islands 101 with unit display parts 200 formed on a substrate 100, and second connection parts 102b. Through parts V that penetrate into the substrate 100 are formed between the islands 101 and the second connection parts 102b.

According to an embodiment, each of the unit display parts 200 includes a planarization layer 209. A display element, such as an organic light-emitting device OLED, is positioned on the planarization layer 209. The planarization layer 209 provides a flat top surface to a region in which the organic light-emitting device OLED is positioned.

In a present embodiment, at least one of an inorganic passivation layer PVX and a lower planarization layer 208 are additionally disposed between the TFT and the planarization layer 209. In addition, a step difference compensation layer 202 is disposed on a part of the substrate 100, such as an end of the substrate 100 of the islands 101. The step difference compensation layer 202 covers sides of the buffer layer 201, the gate insulating layer 203, the first interlayer insulating layer 205, and the second interlayer insulating layer 207 of the unit display part 200.

According to an embodiment, the inorganic passivation layer PVX may be a single layer or multi-layer structure of silicon nitride (SiNx) or silicon oxide (SiOx). The inorganic passivation layer PVX covers and protects the source electrode SE and a part of wirings of the TFT. Wirings formed together in a process of forming the source electrode SE are exposed in a part of a region of the substrate 100. The exposed part of the wirings may be damaged by an etchant used to pattern the pixel electrode 221. However, in a present embodiment, the inorganic passivation layer PVX covers at least a part of the wirings so that the wirings are not damaged in the patterning process of the pixel electrode 221.

According to an embodiment, a lower planarization layer 208 is positioned between the inorganic passivation layer PVX and the planarization layer 209. The lower planarization layer 208 includes an organic insulating material, such as general-purpose polymer such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

According to an embodiment, a connection metal CM that connects the pixel electrode 221 to the TFT is formed in the lower planarization layer 208. In addition, wirings are positioned on the same layer as the connection metal CM.

According to an embodiment, the connection metal CM includes a conductive material, such as Mo, Al, Cu, or Ti, and may have a multi-layer or single layer structure that includes the above-described materials. In this way, as the lower planarization layer 208 is formed, wirings can be positioned on the top surface of the lower planarization layer 208 so that integration of the unit display parts 200 can be improved.

According to an embodiment, the step difference compensation layer 202 is formed on the substrate 100 of the connection parts 102. Although the figure shows the second connection parts 102*b*, the first connection parts 102*a* have a substantially similar structure. The step difference compensation layer 202 includes an organic insulating material, such as polyimide, polyamide, acryl resin, benzocyclobutene, HMDSO, or phenol resin. The step difference compensation layer 202 may have a single layer or multi-layer structure that includes the above-described organic insulating materials.

According to an embodiment, the step difference compensation layer 202 is formed by removing the buffer layer 201, the gate insulating layer 203, the first interlayer insulating layer 205, and the second interlayer insulating layer 207, which are positioned on the substrate 100. In a process of removing the above-described layers, a part of the buffer layer 201, the gate insulating layer 203, the first interlayer insulating layer 205, and the second interlayer insulating layer 207 on the islands 101, is removed, and the step difference compensation layer 202 is filled in the part where the aforementioned layers were removed. Thereafter, the planarization layer 209 and the pixel-defining layer 211 are formed, and the through parts V are formed. Thus, a part of the step difference compensation layer 202 may be positioned on the substrate 100 of the islands 101.

According to an embodiment, the inorganic passivation layer PVX is not formed in the second connection parts 102*b*. That is, the step difference compensation layer 202, the lower planarization layer 208, and the planarization layer 209 are formed in the second connection parts 102*b*. The first connection parts 102*a* have a similar structure.

According to an embodiment, additional wirings W' are formed between the lower planarization layer 208 and the planarization layer 209. The additional wirings W' are formed of the same material as the connection metal CM formed in the islands 101.

According to an embodiment, the opposite electrode 223, the first inorganic encapsulation layer 310, and the second inorganic encapsulation layer 330 are stacked on the planarization layer 209. Because the opposite electrode 223, the first inorganic encapsulation layer 310, and the second inorganic encapsulation layer 330 are formed using an open mask after the through parts V are formed, the opposite electrode 223, the first inorganic encapsulation layer 310, and the second inorganic encapsulation layer 330 cover sides of the through parts V.

According to a present embodiment, the organic encapsulation layer 320 is optionally concentrated on a part of a region in which dust material DM is detected, so that a process time can be reduced compared to forming the organic encapsulation layer 320 on all unit parts, and a region that contains dust material DM is covered with the organic encapsulation layer 320 to prevent the penetration of oxygen and moisture.

According to embodiments, an organic encapsulation layer is optionally concentrated on a region in which a dust material is detected, so that a process time of forming an encapsulation layer can be reduced. Furthermore, the dust material is covered with the organic encapsulation layer to prevent cracks from occurring when the dust material is covered with an inorganic encapsulation layer. Thus, in a display device having a deformed shape, a reliable encapsulation layer can be formed. Of course, the scope of embodiments of the present disclosure is not limited by these effects.

It should be understood that exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
   forming a plurality of islands, wherein the plurality of islands include display elements disposed on a substrate and are spaced apart from each other;

sealing each of the plurality of islands with an encapsulation layer that includes a first inorganic encapsulation layer and a second inorganic encapsulation layer;

detecting dust material contained on a first island and recording coordinate information about the dust material before or after forming the first inorganic encapsulation layer; and forming an organic encapsulation layer on the first island that covers the dust material using the recorded coordinate information about the dust material, wherein the organic encapsulation layer completely covers a top and sides of a protuberance caused by the dust material, wherein the dust material is disposed directly on a display element of the display elements, the first inorganic encapsulation layer is disposed directly on the dust material, and the organic encapsulation layer is disposed directly on the first inorganic encapsulation layer, wherein the organic encapsulation layer does not extend under the protuberance caused by the dust material, wherein the protuberance extends above an upper surface of the display element.

2. The method of claim 1, wherein the first inorganic encapsulation layer and the second inorganic encapsulation layer include inorganic insulating layers.

3. The method of claim 1, wherein the first inorganic encapsulation layer and the second inorganic encapsulation layer are formed using chemical vapor deposition.

4. The method of claim 1, wherein the organic encapsulation layer is formed using inkjet printing or three- dimensional printing.

5. The method of claim 1, wherein the organic encapsulation layer is not formed on an island in which no dust material is detected.

6. The method of claim 1, wherein the plurality of islands are connected by a plurality of connection parts, and the method further comprises forming through parts between the plurality of connection parts that penetrate into a substrate.

7. A method of manufacturing a display device, the method comprising:

forming a plurality of islands, wherein the plurality of islands include display elements disposed on a substrate and are spaced apart from each other;

sealing each of the plurality of islands with an encapsulation layer that includes a first inorganic encapsulation layer and a second inorganic encapsulation layer;

detecting dust material contained on a first island and recording coordinate information about the dust material before or after forming the first inorganic encapsulation layer; and forming an organic encapsulation layer on the first island that covers the dust material using the recorded coordinate information about the dust material, wherein the organic encapsulation layer completely covers a top and sides of a protuberance caused by the dust material, wherein the protuberance extends above an upper surface of the first inorganic encapsulation layer, wherein the dust material is disposed directly on the first inorganic encapsulation layer, and the organic encapsulation layer is disposed directly on the dust material and the first inorganic encapsulation layer.

8. The method of claim 7, wherein the first inorganic encapsulation layer and the second inorganic encapsulation layer include inorganic insulating layers.

9. The method of claim 7, wherein the first inorganic encapsulation layer and the second inorganic encapsulation layer are formed using chemical vapor deposition.

10. The method of claim 7, wherein the organic encapsulation layer is formed using inkjet printing or three- dimensional printing.

11. The method of claim 7, wherein the organic encapsulation layer is not formed on an island in which no dust material is detected.

12. The method of claim 7, wherein the plurality of islands are connected by a plurality of connection parts, and the method further comprises forming through parts between the plurality of connection parts that penetrate into a substrate.

* * * * *